(12) United States Patent
Gao

(10) Patent No.: US 8,369,367 B1
(45) Date of Patent: Feb. 5, 2013

(54) TUNABLE LASER SYSTEM

(76) Inventor: Peiliang Gao, Santa Clara, CA (US)

( * ) Notice: Subject to any disclaimer, the term of this patent is extended or adjusted under 35 U.S.C. 154(b) by 183 days.

(21) Appl. No.: 12/411,667

(22) Filed: Mar. 26, 2009

(51) Int. Cl.
*H01S 3/117* (2006.01)

(52) U.S. Cl. ............. 372/13; 372/20; 359/285; 359/305

(58) Field of Classification Search ............ 372/13, 372/20; 359/285–287, 305–314
See application file for complete search history.

(56) References Cited

U.S. PATENT DOCUMENTS

| | | | |
|---|---|---|---|
| 3,944,334 A | | 3/1976 | Yano et al. |
| 4,707,835 A | * | 11/1987 | Mocker ............... 372/20 |
| 4,720,177 A | | 1/1988 | Chang |
| 5,052,004 A | | 9/1991 | Gratze et al. |
| 5,272,708 A | * | 12/1993 | Esterowitz et al. ............. 372/20 |
| 5,329,397 A | | 7/1994 | Chang |
| 5,936,981 A | | 8/1999 | Wada et al. |
| 6,822,785 B1 | | 11/2004 | Chu et al. |
| 6,930,819 B2 | | 8/2005 | Chu |
| 6,970,484 B2 | | 11/2005 | Paldus |
| 7,057,799 B2 | | 6/2006 | Chu |
| 7,102,809 B2 | | 9/2006 | Singh |
| 7,161,725 B2 | | 1/2007 | Fraser |
| 7,372,612 B2 | | 5/2008 | Chu |
| 2002/0136524 A1 | * | 9/2002 | Agha Riza .................... 385/140 |
| 2007/0280310 A1 | * | 12/2007 | Muenter et al. ................ 372/28 |
| 2008/0025349 A1 | * | 1/2008 | Mizutani et al. ................ 372/20 |

* cited by examiner

*Primary Examiner* — Tod T Van Roy
(74) *Attorney, Agent, or Firm* — Aka Chan LLP

(57) ABSTRACT

A tunable laser system utilizes a frequency shift compensated acousto-optic tunable filter. The wavelength accuracy and stability is achieved by a wavelength locker utilizing two separate intracavity light beams without the need to use beam splitters to significantly reduce the space typically needed by a conventional wavelength locker, and provide more stable operation and easy assembly. The acoustic optical tunable filter includes an acousto-optical crystal with a transducer coupled to the crystal to generate acoustic waves, and an optical mirror to reflect the diffracted light beam back to the acousto-optical medium again such that the frequency shift by two diffractions is compensated. By using different laser gain mediums, acoustic wave driving frequencies and acousto-optical crystals, this invention can be used to make tunable lasers in wide range of optical wavelengths for many different applications.

28 Claims, 8 Drawing Sheets

TUNABLE LASER SYSTEM

BACKGROUND OF THE INVENTION

The present invention relates to the apparatuses and method of wavelength tunable laser with wavelength locker and power monitor. More particularly, this invention relates to a laser resonant cavity implemented with wavelength shift compensated acousto-optic tunable filter and wavelength locker and power monitor design by which the fast tuning speed, stable wavelength and power performance can be realized.

Most modern telecommunications systems are based on fiber optic transmission. The fiber optic networks offer both unprecedented capacity and the deployment flexibility needed to support a wide range of evolving and emerging broadband applications. Widely tunable lasers help to maximize existing fiber optic network resource. The ability to dynamically provision bandwidth provides the ability to move traffic from overcrowded channels to unused channels to meet the demands for Internet access. Tunable laser is also a key prerequisite as networks move towards full mesh-based optical networks where light paths can be set up and changed quickly and easily.

The main features of an ideal tunable laser for such applications can be summarized as follows: wide tuning range covering C and/or L band (about 1530 nanometers to about 1610 nanometers), small footprint, fast tuning speed (in submilliseconds) between any two International Telecommunication (ITU) grids, long term performance stability (over 25 years of operation), highly reliable under severe work conditions, low electrical power consumption, low cost and high manufacturability.

Tunable lasers, especially compact, wide tuning range and high power output tunable lasers, have many applications in biology, medical instrumentation, fiber optic sensor network, etc.

Unfortunately, market penetration of tunable lasers is inhibited by the limitations of existing tunable lasers in their compactness, wavelength tuning range, tuning speed and output power, etc. The current tunable laser systems can be classified into the three types, systems use mechanically movable intracavity elements such as diffraction gratings, prisms, etalons or MEMS (Microelectromechanical systems) as the wavelength tuning elements; systems with thermally tunable elements built into the cavity and wavelengths are selected through thermally heating or cooling the elements; systems employ non-movable intracavity optical elements for tuning, which involves the use of Magneto-optic, Acousto-optic, Electro-optic elements or electric current injection to physically select the wavelength.

Tuning techniques that rely on mechanical adjustment of the angle of a grating or prism, is very susceptible to the mechanical shock and vibration causing short term and long term performance instability, therefore tunable lasers employing moving parts are not suitable for optical telecom applications. Thermal tuning is intrinsically slow, and therefore its applications are limited. Among the technologies which are based on tuning wavelength physically, acousto-optic technology which has been used as tuning element due to its electronic tunability without moving part, fast tuning speed, wide tuning ranges and simplicity to implement, is a viable approach to meet the stringent requirements of tunable lasers for telecom applications as described above. By appropriately selecting the acousto-optical crystals and driving acoustic frequencies, a tunable laser can be designed for operation within a wide range of wavelength spectrum, and for different applications as has been disclosed in some U.S. patents. The key problems with the existing design of external cavity tunable laser utilizing acousto-optic filter for application in fiber optic telecom network are: (1) Doppler frequency shift compensation is usually achieved by two crystals, which makes alignment very difficult. (2) two RF transducers bonded on the same crystal as disclosed in some US patens, which significantly increases the cost. The present invention addresses these issues.

BRIEF SUMMARY OF THE INVENTION

A tunable laser cavity utilizes a frequency shift compensated acousto-optic tunable filter with single radio frequency (RF) transducer. The wavelength accuracy and stability is achieved by a wavelength locker utilizing two separate intracavity light beams without the need to use beam splitters to significantly reduce the space typically needed by a conventional wavelength locker, and provide more stable operation and easy assembly. By using different laser gain mediums, acoustic wave driving frequencies and acousto-optical crystals, this invention can be used to make tunable lasers in wide range of optical wavelengths and output powers.

In particular, this invention provides a unique design and method to make tunable lasers for fiber optic telecom applications for which the submillisecond tuning speed, compactness, and high reliability under severe work environment are paramount. The configuration has advantages of simpler construction for easy assembly and low cost for volume production while maintaining high performance and small footprint.

An aspect of the invention is to provide a method and apparatus of a compact tunable laser with rapid tuning capability and stable wavelength and optical power performance.

Another aspect is to provide a compact, wavelength selecting, stable laser oscillations in laser resonator cavity with a frequency shift compensated acousto-optic tunable filter.

Another aspect is to use a low-cost acousto-optic filter with a single transducer to reduce system cost for volume manufacturing.

Another aspect is to provide a configuration of the wavelength locker for stable operation, easy assembly, and compactness by utilizing the two intracavity light beams from a laser cavity without the need to use beam splitters.

With the embodiments described above, a cost effective, easy manufacturing, high performance tunable laser system for use in fiber optic telecommunication networks, and other applications with stringent requirements can be realized.

In an implementation, a tunable laser includes: an output mirror and an end mirror each having prescribed reflectivity to form a laser cavity; a wavelength tunable laser gain medium disposed in the laser cavity and capable of laser oscillation in a lasing wavelength spectrum of a prescribed range; an intracavity collimating lens; an acousto-optical tunable filter disposed in the laser cavity and to which is inputted an outgoing light from the wavelength tunable laser gain medium by the intracavity collimating lens, where the intracavity collimating lens collimates laser beam inputs to the acousto-optical tunable filter; means for exciting an acoustic wave in a crystal including an acoustical transducer bonded to selected surfaces of the crystal, the acousto-optical tunable filter having a reflection mirror with 100 percent reflectivity for the lasing wavelength spectrum, where the acousto-optical tunable filter, the output mirror, the wavelength tunable laser gain medium, and the end mirror of the laser cavity are arranged so as to reflect only a light component which is diffracted by the acousto-optical tunable filter; a source of radio frequency electrical power for providing radio frequency energy to transducers for tuning a cavity oscillation wavelength by changing the radio frequency; means for exciting the wavelength tunable laser gain medium; an active phase modulator; means for driving the active phase modulator; and means for control signal processing.

In an implementation, a laser device includes: a first mirror; a second mirror; a collimating lens; a laser medium, positioned on an axis line between the first mirror and the collimating lens; an acousto-optic tunable filter, positioned between the first and second mirrors, including a transducer bonded on a selected facet of a crystal, a radio frequency (RF) power source, and a reflection mirror; a phase modulator; a wavelength locker; an electronic signal processing unit coupled to the wavelength locker; and a closed feedback loop signal control unit for changing a radio frequency and driving the phase modulator to lock an oscillating wavelength.

In an implementation, a tunable laser includes: a first mirror; a second mirror; a collimating lens; a laser medium, positioned on an axis line between the first mirror and the collimating lens; an acousto-optic tunable filter, positioned between the first and second mirrors; a phase modulator; a wavelength locker; an electronic signal processing unit coupled to the wavelength locker; a closed feedback loop signal control unit for changing a radio frequency and driving the phase modulator to lock an oscillating wavelength; a lens disposed outside of a laser cavity to collimate and couple a laser beam outputted from an output mirror to a coupling collimator, where the coupling collimator includes a pigtailed optical fiber for receiving the output laser beam; and an etalon disposed in the laser cavity with prescribed optical transmission characteristics using International Telecommunication (ITU) frequency spacing grids to narrow a lasing bandwidth and increase a side mode suppression ratio.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 2.2 is a diagram of wave vectors for illustrating the conditions of an acousto-optic Bragg grating filter for the reflected light beam.

DETAILED DESCRIPTION OF THE INVENTION

Figure 1:
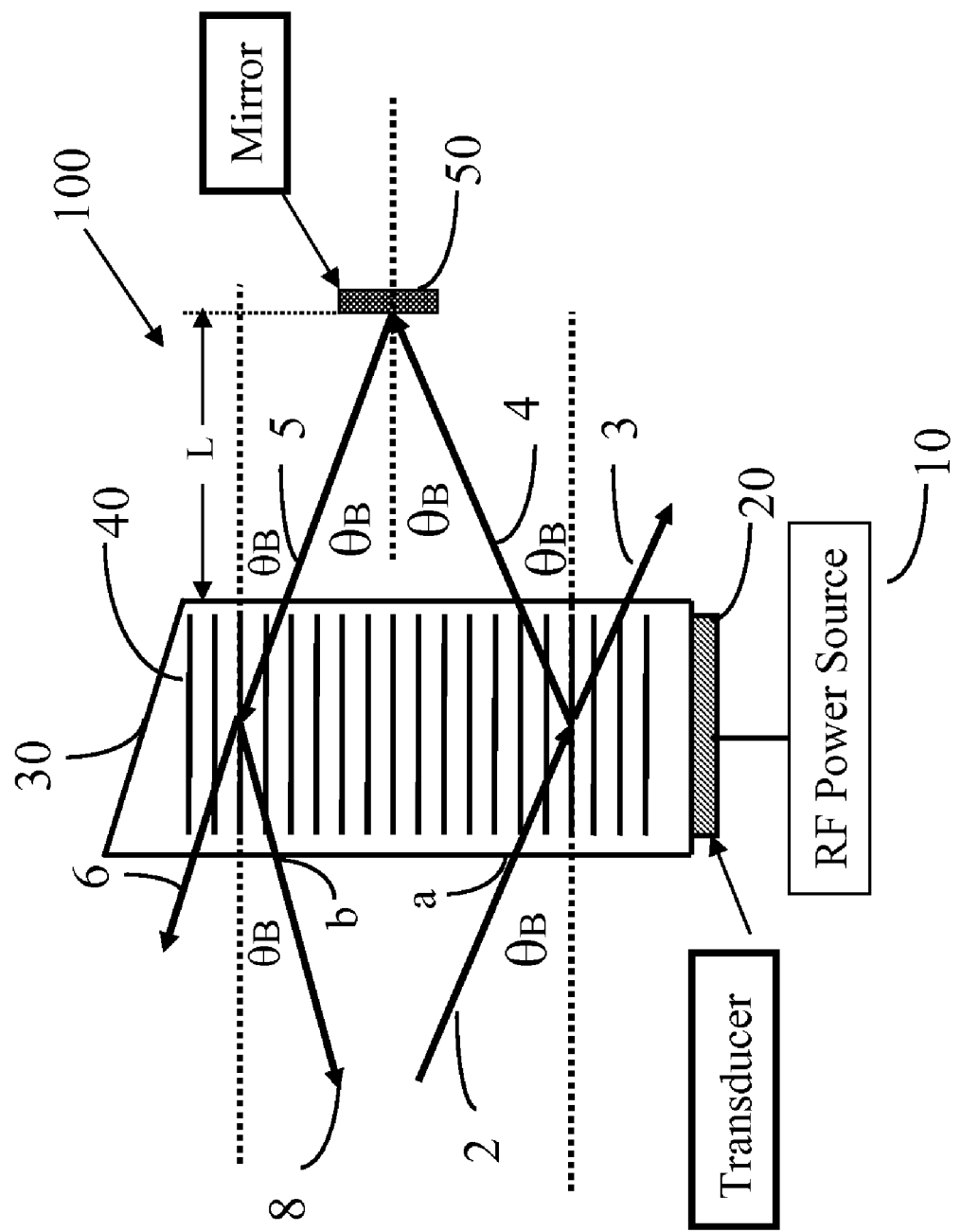
FIG. 1 shows a specific embodiment of a frequency shift compensated, wavelength tunable filter including an acousto-optical crystal with a single transducer, a RF power source driver and an optical reflection mirror.

FIG. 1 shows, one embodiment of a compact, frequency-shift compensated, wavelength tunable optical filter. The embodiment 100 includes a medium 30, an acoustical transducer 20, and radio frequency (RF) power source 10, and an optical mirror 50.

There are two basic types of tunable acousto-optic filters, collinear type and noncollinear type. The noncollinear type includes the isotropic Bragg diffraction type and far-off-axis anisotropic Bragg diffraction type. The far-off-axis anisotropic Bragg diffraction has more practical value due to its narrow tuning bandwidth such as discussed in several U.S. patents.

In one embodiment, the medium 30 is anisotropic and birefrigent, such as when narrow band tuning is desired. One such material, TeO2, operating in shear mode has been used extensively for such applications due to its high optical homogeneity, low light absorption, and high optical power capability.

Other materials such LiNbO3, CaMoO4 and PbMoO4, are also used to build acousto-optical devices. Several factors affect the material choice. The factors include, but are not limited to, the type of acoustic optical device, the availability of quality crystal materials, and the type of applications and their requirements such as diffraction efficiency, power consumption, separation of incident light from diffracted light and overall device size.

The transducer 20 is coupled to the medium. In one embodiment, the transducer 20 is bonded to the crystal— usually with an angled facet opposite to the facet bonded with transducer 20. This eliminates the back reflected acoustic wave from interfering with the forward traveling acoustic waves thereby improving the performance stability.

RF power source 10 drives the transducer 20 to propagate sound waves 40 in the medium 30. The frequencies for many common applications range from about 30 megahertz to a few hundred megahertz. The mirror 50 is positioned to reflect waves diffracted by the medium 30 with the applied sound waves 40, back to the medium 30 at an approximate Bragg angle.

In one embodiment, the mirror 50 is a flat mirror. In other embodiments, the mirror is concave, convex, or optically dispersive depending upon the application. A flat mirror with total reflectivity is preferred for its simplicity and low cost for a marginal stable laser cavity.

A concave mirror with about 100 percent reflectivity may be used for a stable laser cavity. A convex mirror with about 100 percent reflectivity may be used for an unstable laser cavity. A dispersive mirror can be used to further narrow the laser output bandwidth. Preferably, the distance between the mirror 50 and the medium 30 is adjustable.

Referring to FIG. 1, the distance between mirror 50 and medium 30 can be calculated by the following equation:

$L=D/(2 \tan(\Theta_B))$, where D is the laser beam separation between incident beam 2 at entrance point (a) and output beam 8 at exiting point (b), $\Theta_B$ is the Bragg angle. D is determined by the required space needed for a particular cavity structure design. Typically, for a compact cavity design, L should be in the range of about 5 millimeters to about 10 millimeters.

In operation, the light beam 2 enters the medium 30 (e.g., acousto-optic crystal) at Bragg angle, $\Theta_i = \Theta_B$ (i.e., the incident angle equals the Bragg angle). The Bragg angle can be calculated by the equation, $\sin \Theta_B = \lambda_0/(2n\Lambda)$, where $\lambda_0$ is the optical wavelength of the incident light, n is the average refractive index of the medium, and $\Lambda$ is the acoustic wavelength. The acoustic wave 40, established by the transducer, diffracts the optical beam 2 into first order light beam 4 with an output angle $\Theta_B$ and zeroth order light beam 3 propagating in the same direction of the incident beam 2. Thus, the frequency of the power source 10 is the means by which the filter selects a wavelength within the tuning range for output.

Mirror 50 reflects the diffracted light beam 4 back to the medium 30 at Bragg angle $\Theta_B$ as beam 5, which is diffracted into first order light beam 8 with an output angle $\Theta_B$ and a zeroth order light beam 6, which propagates in the same direction as the incident beam 5. The specific embodiment of the tunable optical filter shown in FIG. 1 is further discussed in U.S. patent application Ser. No. 12/391,997, filed on Feb. 24, 2009, which is incorporated by reference along with all other references cited in this application.

Figure 2:
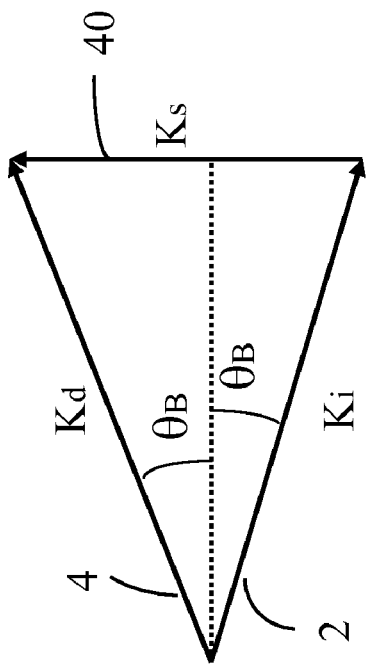
FIG. 2.1 is a diagram of wave vectors for illustrating the conditions of an acousto-optic Bragg grating filter for the first incident light beam.
Figure 1:
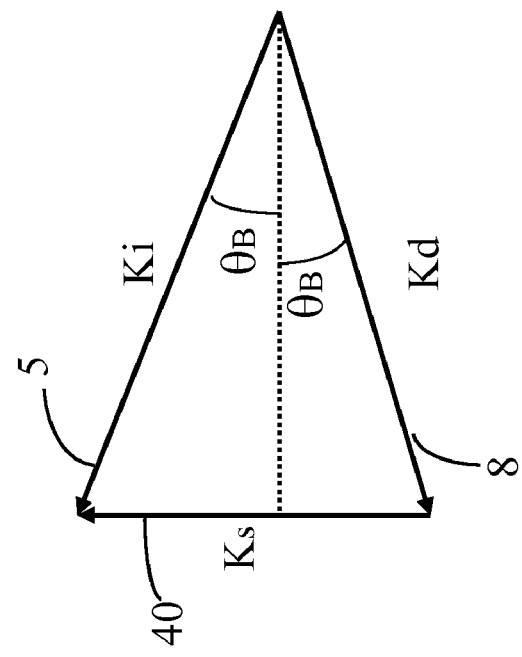

FIGS. 2.1 and 2.2 show the relationships between the wave vectors of incident light ($\kappa_i$), diffracted light ($\kappa_d$), and acoustic waves ($\kappa_s$). As mentioned above, the relationship $\kappa_i \pm \kappa_s = \kappa_d$ always applies. Whether the sign is positive (i.e., "+") or negative (i.e., "−") depends on the direction in which the acoustic wave propagates.

In FIG. 2.1, the wave vector relationship for light beam 2 ($\kappa_2$), light beam 4 ($\kappa_4$), and acoustic wave 40 ($\kappa_s$) is $\kappa_2 + \kappa_s = \kappa_4$. The acoustic wave shifts the diffracted wave upward.

In FIG. 2.2, the wave vector relationship for light beam 5 ($\kappa_5$), light beam 8 ($\kappa_8$), and acoustic wave 40 ($\kappa_s$) is $\kappa_5 - \kappa_s = \kappa_8$. In this case, the acoustic wave shifts the diffracted wave downward. Because the upshift and the downshift are approximately equal, the overall frequency shift of the light beam 8 exiting from the acousto-optical filter 100 is substantially eliminated.

Figure 3:
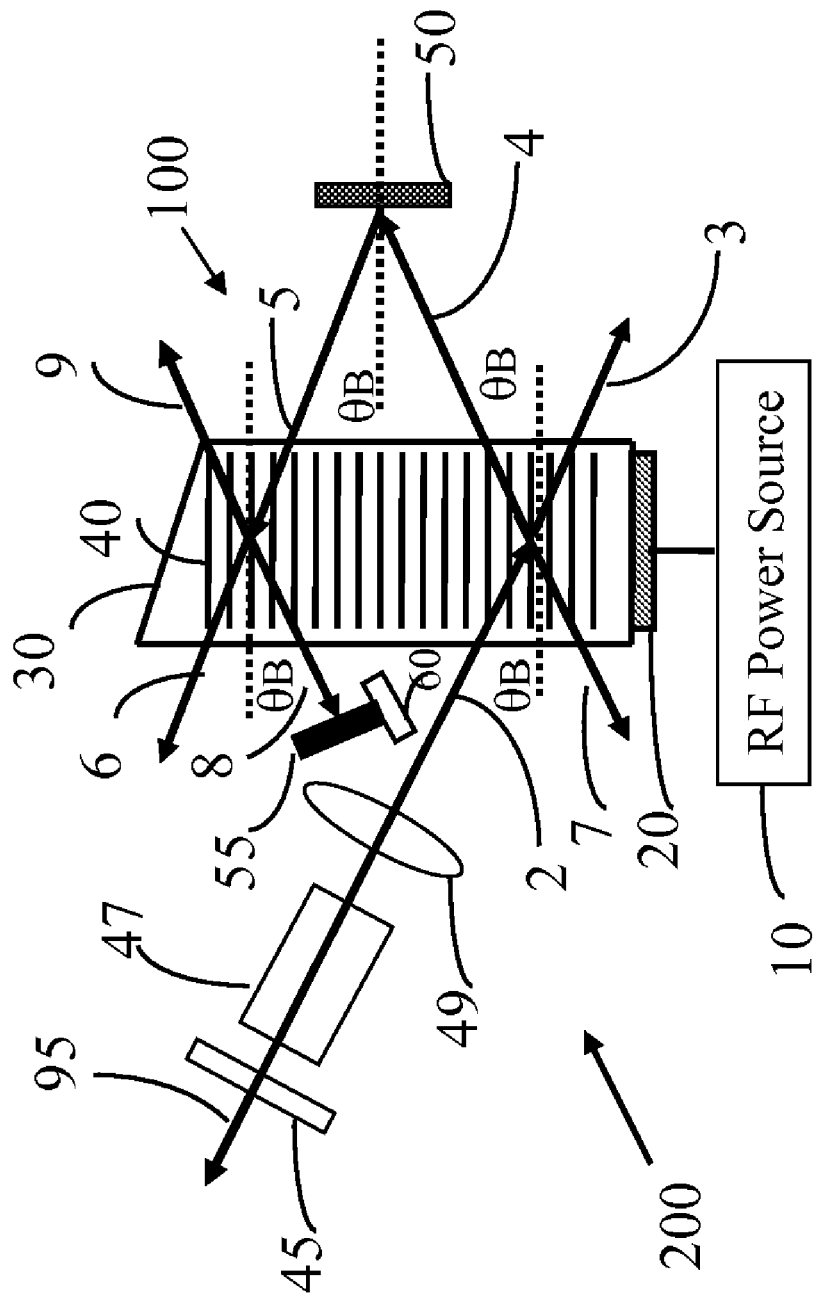
FIG. 3 is a diagrammatic plan view of an embodiment of wavelength tunable laser with one of the laser cavity mirror bonded on a PZT base for lasing mode phase adjustment.

The use of acousto-optic tunable filter (AOTF) 100 as a tunable filter in a tunable laser system 200 is illustrated in FIG. 3. The laser oscillation cavity includes an output mirror 45 with prescribed reflectivity or transmitivity (for instance, the mirror reflects 90 percent of the light inputted and transmits 10 percent of the light inputted) on the outgoing side and a total reflection mirror 55 (e.g., 100 percent reflection) on the return side. Mirrors 45 and 55 form the laser oscillation cavity.

Laser mirrors usually do not reflect all wavelengths or colors of light equally well—their reflectivity is matched to the wavelength bandwidth within which the laser operates. The purpose of the mirrors is to provide what is described as "positive feedback."

Reflective optical coatings may be directly applied to the laser medium itself as is usually the case in semiconductor gain medium. Fabry-Perot cavity or plane-parallel cavity with flat mirrors, which is also called "marginal stable laser cavity," produces a flat zigzag light path, but this type of cavity is very sensitive to mechanical disturbances and walk-off.

Two other types of laser cavities include unstable cavity and stable cavity. The unstable cavity typically uses a convex mirror or a combination of a convex mirror and a flat mirror. The stable cavity typically uses a concave mirror or a combination of a concave mirror and a flat mirror. In practice, different cavity designs and operating conditions are used to produce different output power levels and lasing modes for different applications.

Generally, laser medium 47 is positioned between two mirrors as shown in FIG. 3. This means simply that some of the light that emerges from the amplifying medium is reflected back into it for further amplification. The optical gain medium may be any type of optical gain medium that is configured to amplify light oscillating inside laser cavity.

In the illustrated embodiment for telecommunication applications, the optical gain medium is a semiconductor amplifier, which amplifies light by optically stimulated recombination of holes and electrons in a PN junction. The light emitted from the semiconductor amplifier is characterized by a finite spread of photon energy centered close to the band gap energy of the active region material of the semiconductor amplifier.

A collimating lens 49 transforms the diverging optical beam from the laser gain medium into a collimated optical beam 2. This is critical to reduce the incident beam divergence because the divergence of the diffracted beam by the filter is directly affected by the divergence of incident beam, which is crucial for laser operation performance.

The wavelength selecting acousto-optic filter 100 is positioned between the collimating lens 49 and the reflection mirror 50. The wavelength is selected for oscillating inside the laser cavity by changing the RF frequency and moving mirror 55 along the cavity beam 8 by lead zirconate titanate (PZT) base 60 for lasing mode phase matching for different wavelengths. Note that the mirror 50 can also be moved for phase matching purpose by attaching it to a PZT base with a driver while the position of mirror 55 is fixed. Beam 3, 6, 7 and 9 are the zeroth order of the diffractions from intracavity beam 2, 5, 4 and 8 respectively, and "leaked" from the laser cavity during lasing oscillations, which add some losses to the laser cavity. These "leaked" beams can be used for laser power monitoring and wavelength locking purposes as discussed in details below.

Figure 4:
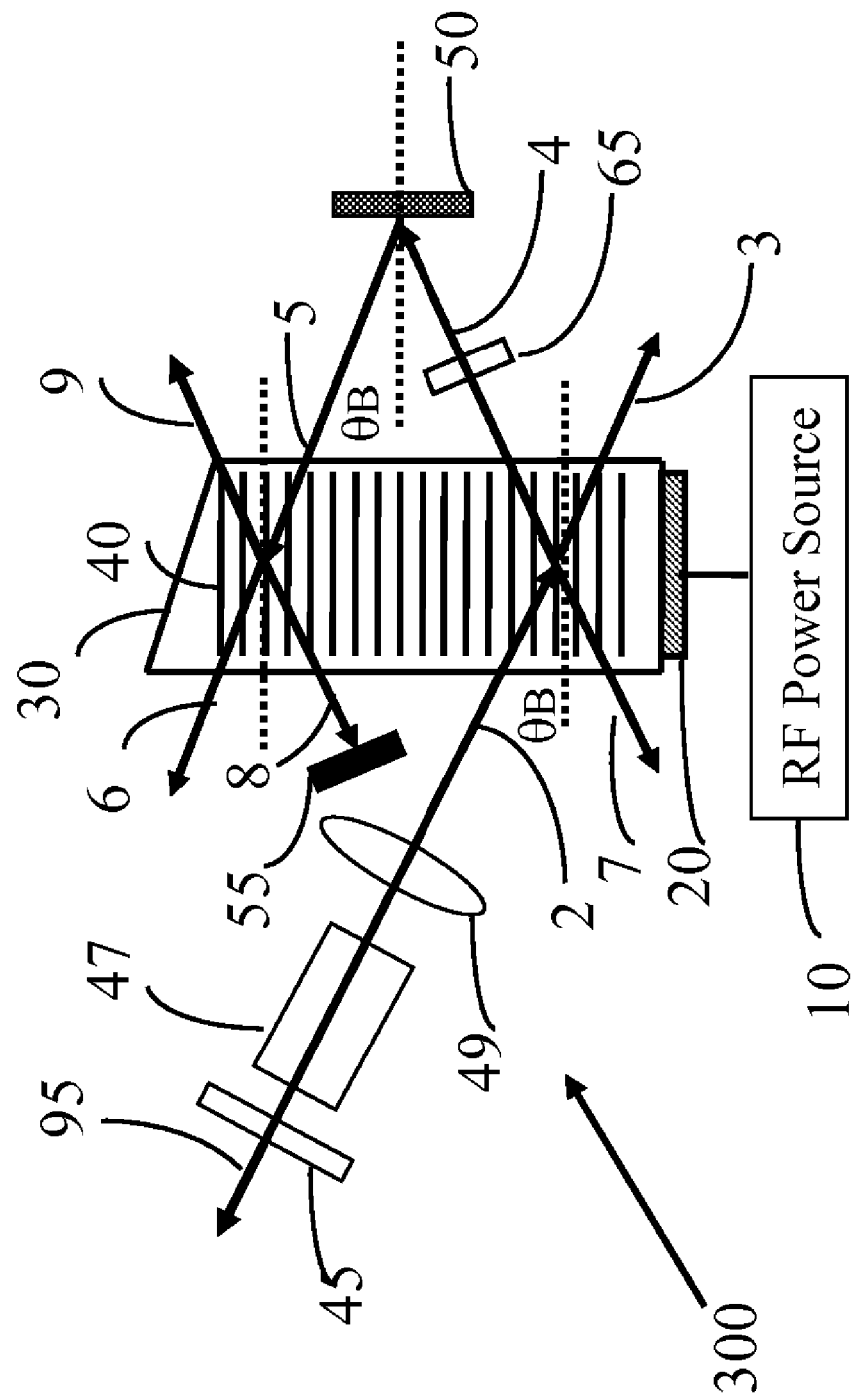
FIG. 4 is a diagrammatic plan view of an embodiment of wavelength tunable laser with a phase modulator for cavity phase adjustment.

FIG. 4 shows laser system 300, which is the same system as tunable laser 200 in FIG. 3 except the PZT in FIG. 3 is replaced by a phase modulator 65. Phase modulator 65 is inserted into tunable filter 100 along beam 4 for lasing mode phase matching. In one embodiment, the phase modulator 65 is an opto-electrical modulator.

Other versions of optical phase modulators are also possible. Depending upon the specific requirements, several factors affect the selection of a phase modulator. The factors include, but are not limited to, power consumption, footprint size of laser cavity, laser cavity loss, tuning speed, availability for the tuning wavelength range and cost. Theoretically, the phase modulator 65 can be positioned anywhere inside laser cavity where space is available. For example, the phase modulator can be positioned between lens 49 and medium 30, or between medium 30 and mirror 50, or medium 30 and mirror 60.

For good (e.g., optimal or best) performance, phase modulator 65 should be positioned inside laser cavity where the beam has the minimum divergence. In the laser 200 system shown in FIG. 3, the phase modulator 65 could be located between medium 30 and mirror 50.

Figure 5:
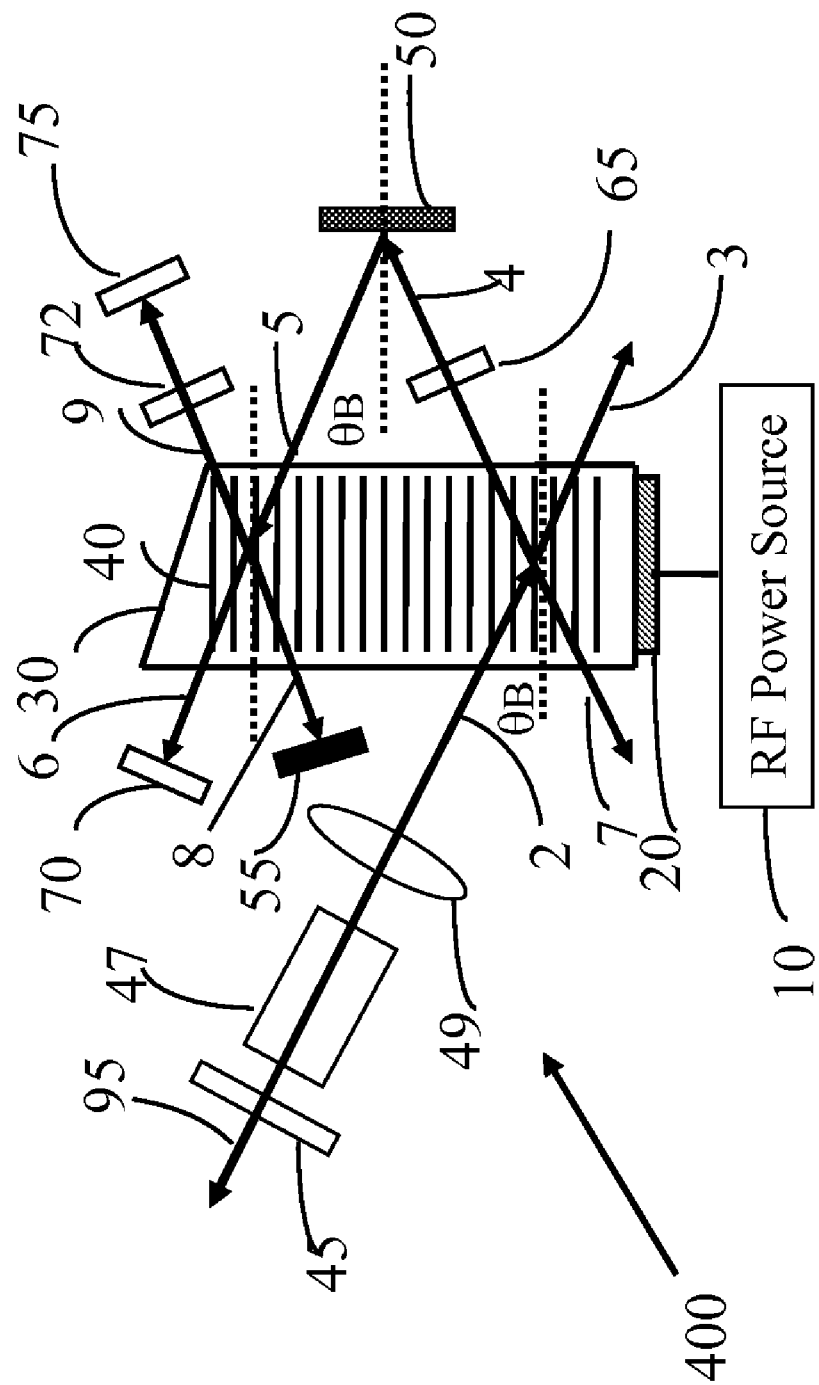
FIG. 5 is diagrammatic plan view of an embodiment of wavelength tunable laser with power monitor and wavelength locker

FIG. 5 shows the tunable laser system 400 with a wavelength locker. The wavelength locker includes a photo detector 70 and 75 and a wavelength dependent, variable transmission optical filter 72. The optical filter 72 is positioned between medium 30 and photo detector 75 in the optical path of beam 9. Photo detector 75 detects the power variation due to the shift of the lasing wavelength, and photo detector 70 detects the lasing power through the beam 6. Beam 3 and beam 7 can also be used for such purposes as beam 6 and beam 9

Multiple layer dielectric thin film filter and low finesse etalon are often used for such purposes. In one embodiment, optical filter (or part) 72 is a multiple layer dielectric thin film filter. In another embodiment, part 72 is a low finesse etalon. Both thin film filter and etalon can be designed and fabricated at low cost according to the specific requirement of the relationship between transmission ratio and wavelength. Since two intracavity beams are used to construct the wavelength locker, there is no need for additional components such as a beam splitter, which therefore reduces the overall laser space and cost.

Figure 6:
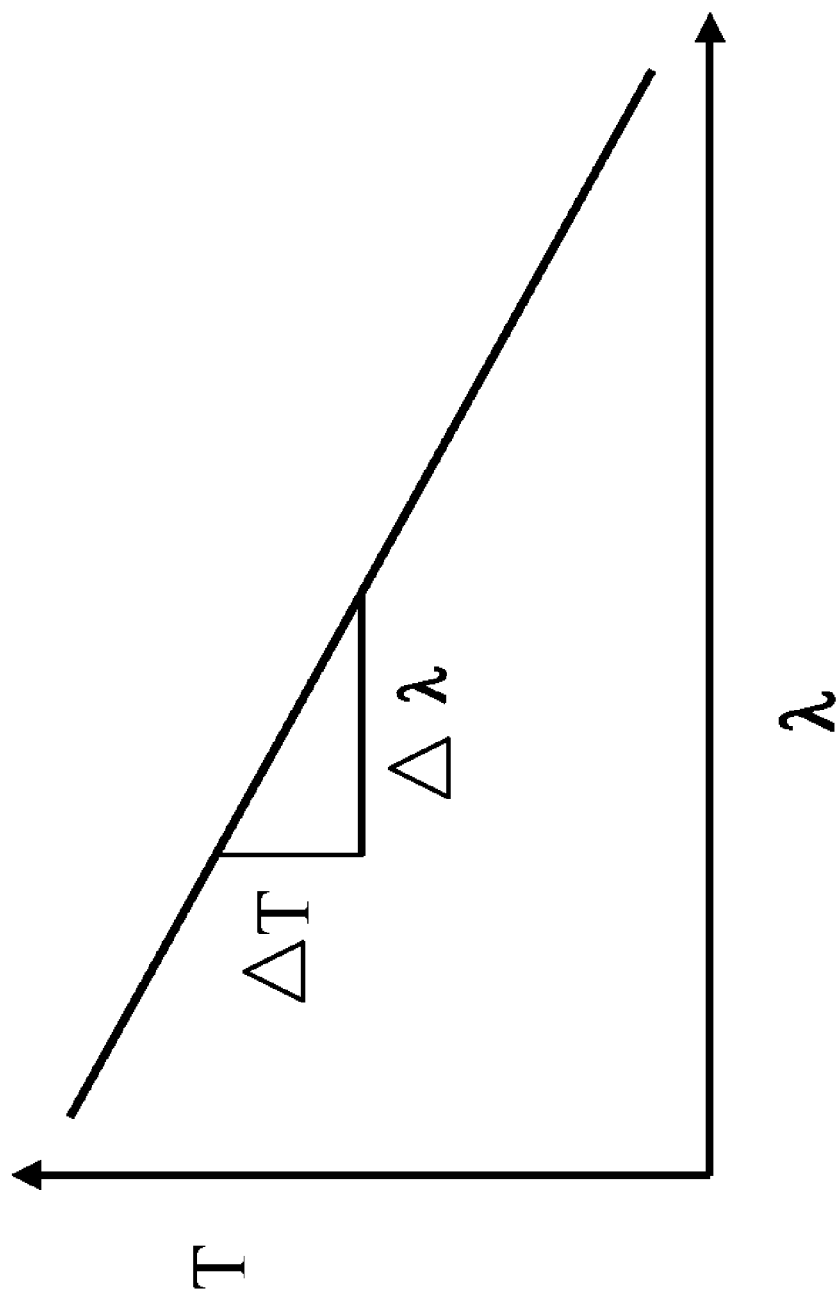
FIG. 6 shows the linear or quasi-linear relation between power transmission and wavelength by a low finesse etalon or a multilayer dielectric thin film filter for wavelength locking purpose.

FIG. 6 shows the relation between the wavelength and transmission rate (T) of part 72. The relation between transmitted power from part 72 and the wavelength can be expressed as $\lambda=\alpha T+\beta$, where $\alpha$ and $\beta$ are the constants determined by the slope of the insertion loss versus wavelength using the linear approximation. The quantity $\alpha$ can be designed according to the application, tuning wavelength range, and resolution required for wavelength locking.

Since the received power is directly proportional to the transmission rate T, the relation between the $\lambda$ and received power (P) can be expressed as $\lambda=\alpha P+\beta$, which can be further expressed as: $\Delta\lambda=\alpha\Delta P$ assuming laser cavity power change is detected by photo detector 70 and the laser power does not change. Therefore, the power change ($\Delta P$) received by photo detector 75 is completely caused by the wavelength change ($\Delta\lambda$).

This information is feedback to the radio frequency driver 10 and phase modulator 65. This makes the corresponding changes to pull the wavelength back to the prescribed wavelength by changing the RF signal frequency. This stabilizes the laser oscillating wavelength. In normal laser operation of laser system 400, the laser power can be monitored accurately by photo detector 70. This information can be used to monitor and maintain the laser output power through a feedback control loop.

Figure 8:
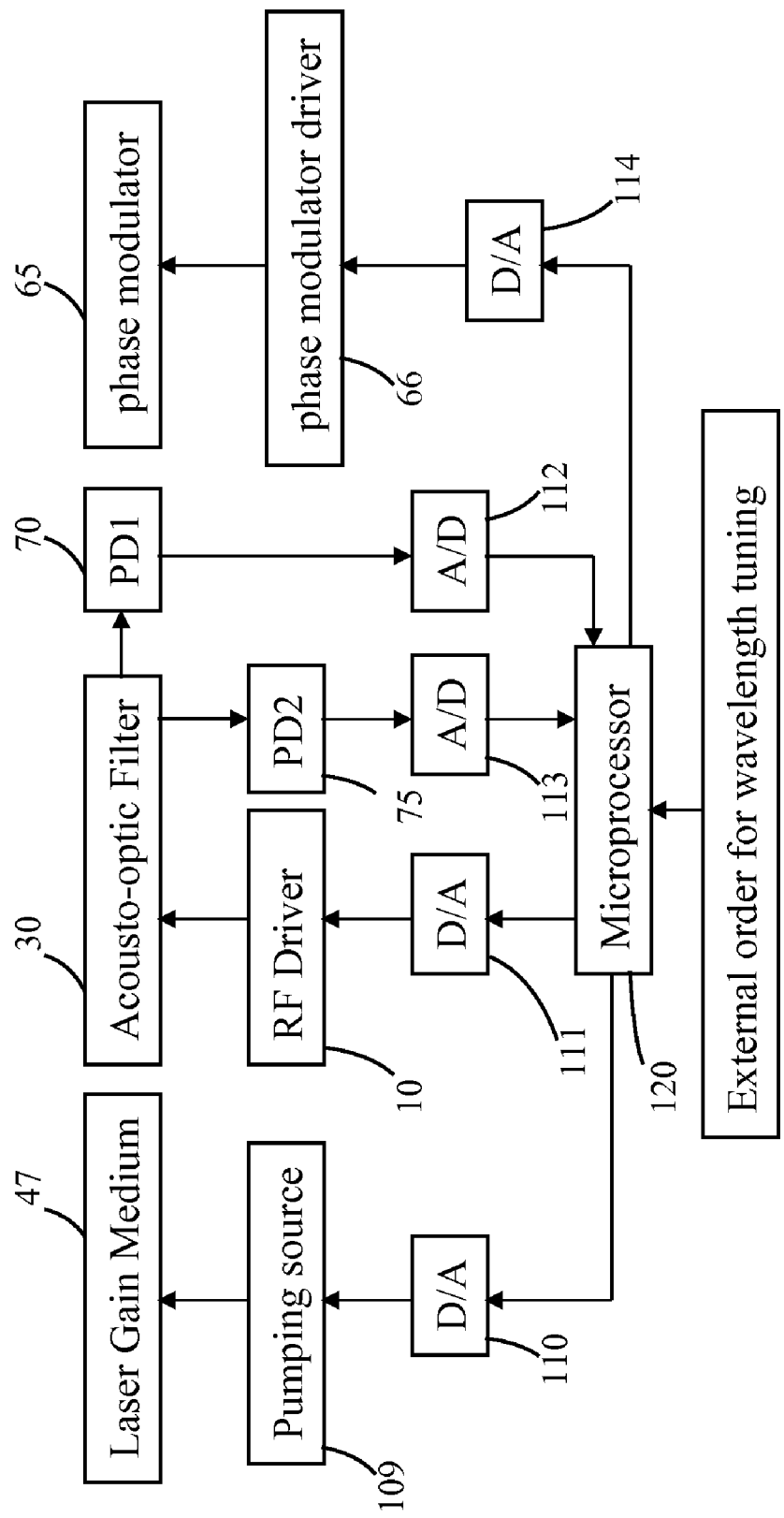
FIG. 8 is a functional block diagram of the laser system with feedback control loops.

FIG. 8 shows the functional block diagram of the laser system 400 with feedback control loops. The central control unit is a microprocessor with embedded firmware. Through the A/D (analog to digital) devices 112 and 113, the microprocessor 120 receives the signals from photo detectors 70 and 75. The signals include the information about the laser output power and wavelength shift. The information is processed by the firmware embedded with the microprocessor 120. The microprocessor sends signals to RF source driver 10, phase modulator driver 66, and pumping source 109 through D/A (digital to analog) devices 111, 114 and 110 respectively to make adjustments to the RF frequency, phase matching conditions, and pumping power. This is so that both laser output power and wavelength can be stabilized if a power shift, wavelength shift, or both occurs or if the external wavelength tuning order and/or laser output power change order are received.

A feature of the invention includes a configuration that utilizes two intracavity beams. This has several advantages over the conventional configuration:

(1) Compactness. The laser cavity shown in FIG. 5 is more compact than in the prior art as disclosed in some U.S. patents. In a specific implementation, the size (e.g., length, width, and depth) of such a laser cavity is about 20 millimeters×10 millimeters×5 millimeters or has a volume of about 1000 cubic millimeters.

(2) Lower cost. Generally, only three components are needed: optical part 72, and two photo detectors 70 and 75. No beam splitter or other components are needed.

(3) Easy assembly. Since two photo detectors 70 and 75 can be assembled separately, it reduces interdependency of optical alignment of the components, and therefore, reduces the assembly complexity, and provides more tolerances for each component.

(4) More reliable and stable performance. Due to the advantages described above, the configuration is less susceptible to the mechanical disturbances and stresses.

Figure 7:
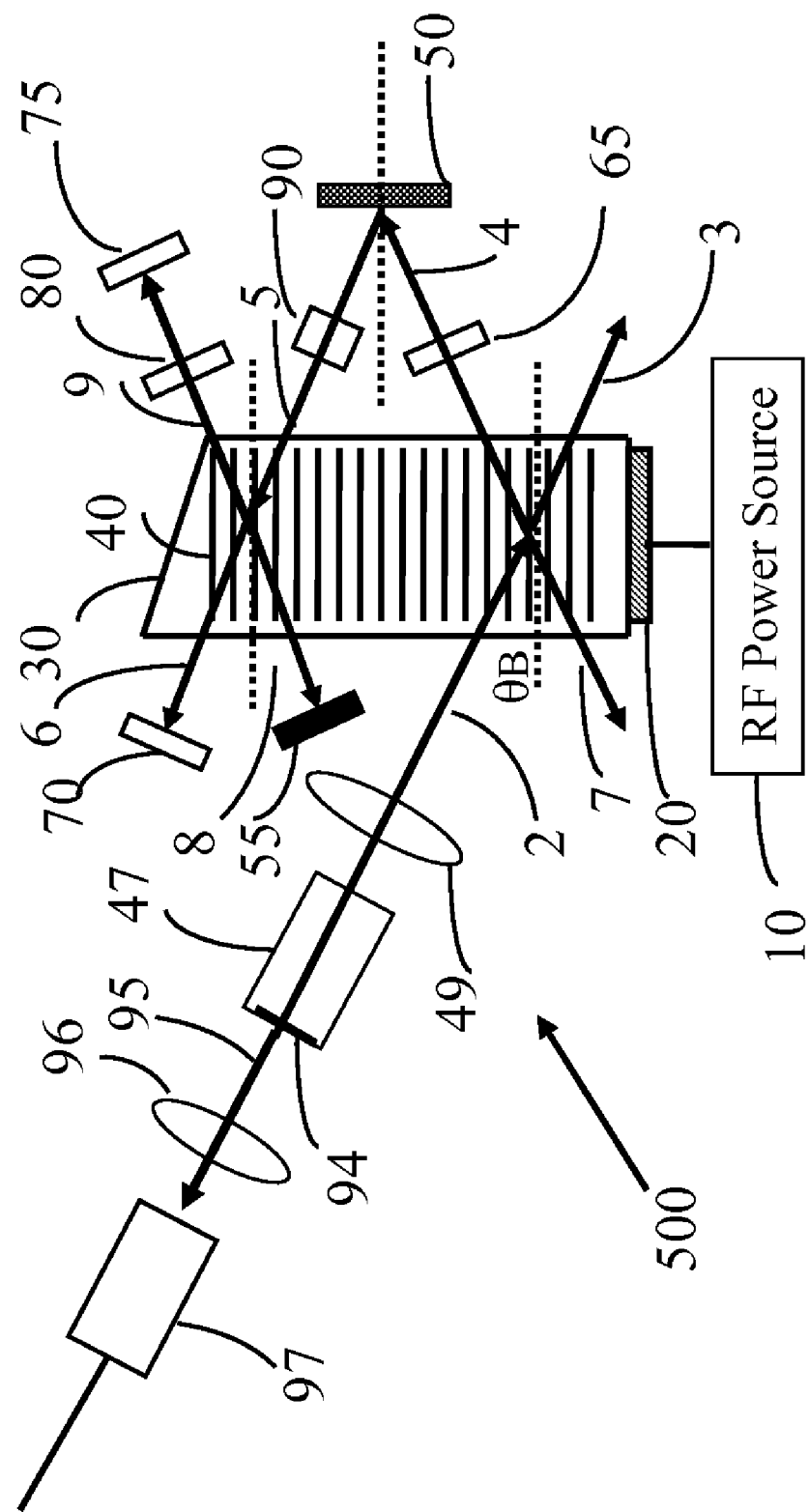
FIG. 7 is a diagrammatic plan view of an embodiment of wavelength tunable laser with power monitor, wavelength locker and 25 gigahertz or 50 gigahertz or 100 gigahertz etalon for ITU grid mode selection, and a pigtail typically needed for fiber optical telecommunication.

In order to use the tunable laser 400 depicted in FIG. 5 for fiber optical telecommunication application, there are a couple of components needed, cavity etalon 90 designed to operate at an ITU grid (i.e., 25-gigahertz, 50-gigahertz, and 100-gigahertz laser oscillation frequency peak spacing) and a pigtailed collimator 96 to connect the laser output beam 95 to an optical fiber as shown in FIG. 7.

Typically, the collimator 96 uses PM (polarization maintaining) fiber for such an application. Other type of fibers such as single mode fiber can also be used if there is no need to maintain the state of polarization for output laser beam. In FIG. 7, the cavity etalon 90 is positioned inside tunable filter 100 between crystal 30 and mirror 50. The typical distance between cavity etalon 90 and crystal 30 and between cavity etalon 90 and mirror 50 ranges from about 5 millimeters to about 10 millimeters. This allows for easy manufacturing assembly.

For good performance (e.g., optimal or best performance), cavity etalon 90 should be positioned where the cavity laser beam has the lowest beam divergence inside laser cavity. In laser cavity 500 as illustrated in FIG. 7, the etalon 90 could be located between phase modulator 65 and crystal 30 where the laser beam has smaller divergence angle. However, the distance L has to be increased if both phase modulator 65 and etalon 90 are located between crystal 30 and mirror 50 along the beam 4.

In practice, other factors such as overall footprint size of the laser system and available space inside the cavity also affects the position of cavity etalon 90. The output mirror 45 in laser system 400 is replaced with a partial reflective multilayer dielectric thin film coating 94. The typical reflectivity of coating 94 directly applied to the semiconductor gain medium is between about 10 percent to about 90 percent.

For 100 gigahertz or 50 gigahertz DWDM fiber optical telecommunications in C and L band (wavelength between about 1530 nanometers to about 1610 nanometers), the tunable filter 100 utilizing noncollinear far-off-axis anisotropic Bragg diffraction is employed. In one embodiment, the far-off-axis anisotropic Bragg diffraction is generated above a certain frequency and the incident angle increases abruptly to generate wavelength filtering.

For narrow band filter application, this type of Bragg diffraction is often used. As a matter of preference and not of limitation, the crystal is made of telluride oxide (TeO2) which has an extremely low acoustic velocity, in addition to its other desired properties (i.e., acoustically anisotropic and optically birefringent) as was discussed in some U.S. patents and published books. Some commonly used crystals to build AOTF are LiNbO3, CaMoO4, and TeO2. The acoustic wave velocity of TeO2 is $0.6\times10^5$ centimeters per second in nonlinear mode. LiNbO3 in collinear mode has an acoustic velocity of $6.57\times10^5$ centimeters per second, and CaMoO4, $6.0\times10^5$ centimeters per second in collinear mode.

The phase modulation by modulator 65 in tunable laser system 400, 500, and 600 can be achieved by a PZT base attached to mirror 55 such as the one used in laser system 200 as shown in FIG. 3 to move mirror 55 in the direction along the beam 8 to change the cavity length for laser cavity mode phase matching.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A tunable laser comprising: an end mirror having prescribed reflectivity to form a laser cavity; a wavelength tunable laser gain medium disposed in the laser cavity and capable of laser oscillation in a lasing wavelength spectrum of a prescribed range; an intracavity collimating lens; a wavelength tunable filter comprising a single acousto-optic crystal and a single acoustical transducer bonded to a selected surface of the crystal, disposed in the laser cavity and to which is inputted an outgoing light from the wavelength tunable laser gain medium by the intracavity collimating lens, wherein the intracavity collimating lens collimates laser beam inputs to the wavelength tunable filter; an intracavity reflection mirror, wherein the intracavity reflection mirror and end mirror are on opposite sides of the crystal, wherein the transducer excites an acoustic wave in the crystal, the intracavity reflection mirror has approximately 100 percent reflectivity for the lasing wavelength spectrum, the wavelength tunable filter diffracts an incoming light beam which results in a first diffracted light having a positive wavelength shift relative to the incoming light beam, the first diffracted light is reflected by the intracavity reflection mirror back to the crystal at a Bragg angle, the wavelength tunable filter diffracts this reflected first diffracted light which results in a second diffracted light having a negative wavelength shift relative to the first diffracted light, and an overall wavelength shift of the first and second diffracted lights is zero, the second diffracted light is then reflected by the end mirror back to the crystal, returns to the intracavity reflection mirror from the crystal, is reflected and again passes through the crystal to the lens; a source of radio frequency electrical power for providing radio frequency energy to the transducer for tuning a cavity oscillation wavelength by changing the radio frequency; means for exciting the wavelength tunable laser gain medium; an active phase modulator; means for driving the active phase modulator; and means for control signal processing.

2. The tunable laser of claim 1 wherein the wavelength tunable filter is disposed approximately at a Bragg angle relative to a laser beam and is maintained at approximately the Bragg angle for different wavelengths of the laser beam.

3. The tunable laser of claim 1 wherein the wavelength tunable filter and wavelength tunable laser gain medium are aligned in the laser cavity so that only a light which is diffracted by the wavelength tunable filter can start lasing.

4. The tunable laser of claim 1 wherein the active phase modulator is an opto-electric phase modulator or another form of phase modulator based on physical optical effects.

5. The tunable laser of claim 1 wherein when folding an optical beam back to the wavelength tunable filter at a Bragg angle along a direction of acoustic wave propagation, a lasing wavelength shift is compensated by only one acoustical transducer.

6. The tunable laser of claim 1 wherein the laser cavity comprises not more than one wavelength tunable filter.

7. The tunable laser of claim 1 comprising:
an output mirror, wherein the output mirror and intracavity reflection mirror are on opposite sides of the crystal, and the output mirror comprises a dielectric thin film mirror coated directly on the laser gain medium with partial reflectivity.

8. The tunable laser of claim 2 wherein the end mirror comprises a concave mirror.

9. The tunable laser of claim 1 wherein the end mirror comprises a convex mirror.

10. The tunable laser of claim 1 wherein the end mirror comprises a flat mirror.

11. The tunable laser of claim 1 wherein the intracavity reflection mirror comprises a concave mirror.

12. The tunable laser of claim 1 wherein the intracavity reflection mirror comprises a convex mirror.

13. The tunable laser of claim 1 wherein the intracavity reflection mirror comprises a flat mirror.

14. The tunable laser of claim 1 wherein the intracavity reflection mirror comprises a dispersive mirror type.

15. The tunable laser of claim 1 wherein the intracavity reflection mirror comprises a surface that is parallel to the propagation direction of the acoustic waves in the crystal.

16. A laser device comprising: a first mirror; a second mirror; a collimating lens; a laser medium, positioned on an axis line between the first mirror and the collimating lens; an acousto-optic tunable filter positioned between the first and second mirrors, comprising a transducer bonded on a selected facet of a crystal, a radio frequency (RF) power source, and a reflection mirror, wherein the reflection mirror and the second mirror are on opposite sides of the acousto-optic tunable filter, the acousto-optic tunable filter diffracts an incoming light beam which results in a first diffracted light having a positive wavelength shift relative to the incoming light beam, the first diffracted light is reflected by the reflection mirror back to the crystal at a Bragg angle, the acousto-optic tunable filter diffracts this reflected first diffracted light which results in a second diffracted light having a negative wavelength shift relative to the first diffracted light, and an overall wavelength shift of the first and second diffracted lights is zero, the second diffracted light is then reflected by the second mirror back to the crystal, returns to the reflection mirror from the crystal, is reflected and again passes through the crystal to the lens; a phase modulator; a wavelength locker, which locks a lasing wavelength when a lasing wavelength shift is detected based on leaked beams exiting the crystal; an electronic signal processing unit coupled to the wavelength locker; and a closed feedback loop signal control unit for changing a radio frequency and driving the phase modulator to lock an oscillating wavelength.

17. The laser device of claim 16 wherein the wavelength locker comprises a first photo detector disposed outside of a cavity of the device for detecting lasing cavity power, a variable transmission optical filter disposed outside of the cavity which receives a beam reflected by the second mirror and transmits an output laser beam, and a second photo detector disposed outside of the cavity receiving the output laser beam transmitted from the variable transmission filter.

18. The laser device of claim 17 wherein the variable transmission optical filter is a multiple layer dielectric thin film filter.

19. The laser device of claim 17 wherein the variable transmission optical filter is an etalon.

20. The tunable laser of claim 16 wherein when folding an optical beam back to the acousto-optic tunable filter at a Bragg angle along a direction of acoustic wave propagation, a lasing wavelength shift is compensated through only one acousto-optic tunable filter.

21. A tunable laser comprising: a first mirror; a second mirror; a collimating lens; a laser medium, positioned on an axis line between the first mirror and the collimating lens; an acousto-optic tunable filter, positioned between the first and second mirrors, comprising an acoustically anisotropic and optically birefringent crystal having one acoustical transducer bonded to a surface of the crystal, wherein the acoustical transducer is used to excite an acoustic wave in the crystal; an intracavity reflection mirror, wherein the intracavity reflection mirror and second mirror are on opposite sides of the crystal; a phase modulator; a wavelength locker; an electronic signal processing unit coupled to the wavelength locker; a closed feedback loop signal control unit for changing a radio frequency and driving the phase modulator to lock an oscillating wavelength; a lens disposed outside of a laser cavity to collimate and couple a laser beam outputted from the first mirror to a coupling collimator, wherein the coupling collimator comprises a pigtailed optical fiber for receiving the output laser beam; and an etalon disposed in the laser cavity with prescribed optical transmission characteristics using International Telecommunication (ITU) frequency spacing grids to narrow a lasing bandwidth and increase a side mode suppression ratio, wherein the acousto-optic tunable filter diffracts an incoming light beam which results in a first diffracted light having a positive wavelength shift relative to the incoming light beam, the first diffracted light is reflected by the intracavity reflection mirror back to the crystal at a Bragg angle, the acousto-optic tunable filter diffracts this reflected first diffracted light which results in a second diffracted light having a negative wavelength shift relative to the first diffracted light, and an overall wavelength shift of the first and second diffracted lights is zero, the second diffracted light is then reflected by the second mirror back to the crystal, returns to the intracavity reflection mirror from the crystal, is reflected and again passes through the crystal to the collimating lens; when folding the first optical beam back to the acousto-optic tunable filter at a Bragg angle relative to the acoustic wave propagating in the crystal a lasing wavelength shift is compensated by using the acoustical transducer.

22. The tunable laser of claim 21 wherein the coupling collimator comprises a single mode, polarization maintaining (PM) fiber.

23. The tunable laser of claim 21 wherein the etalon comprises peak optical transmission characteristics of 25 gigahertz, or 50 gigahertz, or 100 gigahertz.

24. The tunable laser of claim 21 wherein the acousto-optic tunable filter comprises a lithium niobate (LiNbO3) crystal.

25. The tunable laser of claim 21 wherein the acousto-optic tunable filter comprises a telluride oxide (TeO2) crystal.

26. The tunable laser of claim 21 wherein the first mirror is replaced by a partial reflection coating directly coated on a semiconductor gain medium.

27. The tunable laser of claim 21 wherein when folding an optical beam back to the acousto-optic tunable filter at a Bragg angle along a direction of acoustic wave propagation, a lasing wavelength shift is compensated through the crystal having only one acoustical transducer.

28. A tunable laser comprising: an output mirror and an end mirror each having prescribed reflectivity to form a laser cavity; a wavelength tunable laser gain medium disposed in the laser cavity and capable of laser oscillation in a lasing wavelength spectrum of a prescribed range; an intracavity collimating lens; an acousto-optical tunable filter disposed in the laser cavity and to which is inputted a light exiting from the wavelength tunable laser gain medium through the intracavity collimating lens, wherein the intracavity collimating lens collimates laser beam inputs to the acousto-optical tunable filter; the acousto-optical tunable filter comprising means for exciting an acoustic wave in a crystal comprising not more than a single acoustical transducer bonded to a selected surface of the crystal, the acousto-optical tunable filter having a reflection mirror with 100 percent reflectivity for the lasing wavelength spectrum, wherein the acousto-optical tunable filter diffracts an incoming light beam which results in a first diffracted light having a positive wavelength shift relative to the incoming light beam, the first diffracted light is reflected by the reflection mirror back to the crystal at a Bragg angle, and the acousto-optical tunable filter diffracts this reflected first diffracted light which results in a second diffracted light having a negative wavelength shift relative to the first diffracted light, and an overall wavelength shift of the first and second diffracted lights is zero, the second diffracted light is then reflected by the end mirror back to the crystal, returns to the reflection mirror from the crystal, is reflected and again passes through the crystal to the lens; a source of radio frequency electrical power for providing radio frequency energy to the transducer for tuning a cavity oscillation wavelength by changing the radio frequency; means for exciting the wavelength tunable laser gain medium; an active phase modulator; means for driving the active phase modulator; and means for control signal processing, wherein the reflection mirror and end mirror are positioned on opposite sides of the crystal.

* * * * *